US012641736B2

(12) United States Patent    (10) Patent No.:   US 12,641,736 B2

McCurdy                      (45) Date of Patent:      May 26, 2026

(54) CENTRIFUGAL SWITCH ACTIVATED DEVICE

(71) Applicant: Derrick Ray McCurdy, Aurora, IL (US)

(72) Inventor: Derrick Ray McCurdy, Aurora, IL (US)

( * ) Notice: Subject to any disclaimer, the term of this patent is extended or adjusted under 35 U.S.C. 154(b) by 447 days.

(21) Appl. No.: 18/244,005

(22) Filed: Sep. 8, 2023

(65) Prior Publication Data

US 2024/0114637 A1     Apr. 4, 2024

Related U.S. Application Data

(60) Provisional application No. 63/411,371, filed on Sep. 29, 2022.

(51) Int. Cl.
    *H05K 5/02*         (2006.01)
    *H01H 35/10*       (2006.01)

(52) U.S. Cl.
    CPC ........... *H05K 5/0217* (2013.01); *H01H 35/10* (2013.01)

(58) Field of Classification Search
    CPC ............................. H05K 5/0217; H01H 35/10
    See application file for complete search history.

(56) References Cited

U.S. PATENT DOCUMENTS

| | | | | | |
|---|---|---|---|---|---|
| 4,858,303 | A | * | 8/1989 | Fisher | H01H 35/10 |
| | | | | | 29/525.12 |
| 5,411,429 | A | * | 5/1995 | Klawiter | A63H 33/22 |
| | | | | | 446/439 |
| 2007/0281581 | A1 | * | 12/2007 | Rago | A63H 1/24 |
| | | | | | 446/242 |
| 2012/0238177 | A1 | * | 9/2012 | Martino | A63H 33/18 |
| | | | | | 446/56 |
| 2015/0325395 | A1 | * | 11/2015 | Wehrheim | H01H 35/10 |
| | | | | | 200/80 R |
| 2019/0030443 | A1 | * | 1/2019 | Van Dan Elzen | A63H 1/24 |
| 2023/0037021 | A1 | * | 2/2023 | Hoang | A63H 33/18 |

* cited by examiner

*Primary Examiner* — Stephanie E Bloss
*Assistant Examiner* — Diana Hancock
(74) *Attorney, Agent, or Firm* — The Law Offices of Konrad Sherinian, LLC; Jeffrey S. Dixon

(57) ABSTRACT

A centrifugally activated electronic device without an external switch. The electronic device includes an activation circuit, a power source, and electronic components sealed within a housing. The activation circuit includes a pair of centrifugal switches on opposite sides of the housing, which are closed by rapidly rotating the device housing, to complete the activation circuit and thereby turn on at least one of the electronic components. The electronic components include a power switch component that can be turned on by energizing the activation circuit and turned off manually via a powered, buttonless user interface, such as a graphical touch screen, and/or automatically when the electronic components detect a shutoff condition.

17 Claims, 2 Drawing Sheets

CENTRIFUGAL SWITCH ACTIVATED DEVICE

CROSS-REFERENCE

This application claims the priority benefit of U.S. provisional application No. 63/411,371, filed Sep. 29, 2022 and entitled CENTRIFUGAL SWITCH ACTIVATED DEVICE, which is hereby incorporated by reference in its entirety.

FIELD OF THE DISCLOSURE

The present disclosure relates to electronic devices having sealed housings free of buttons or switches.

BACKGROUND

Many electronic devices, such as dive computers, electronic fuel sensors, and certain models of smartphones are required to be durable and/or waterproof. In addition, a power switch is desirable to be able to turn such devices on and off as needed, in order to conserve their internal power sources. However, external buttons and switches are problematic for the durability and waterproof sealing of a device housing. A need therefore exists for an electronic device that can be turned on and off without external buttons or switches.

SUMMARY

According to an aspect of the disclosure, a centrifugally activated electronic device comprises a housing that encloses and seals an internal space. An activation circuit is disposed within the internal space along with a power circuit that includes certain electronic components and is connected to a power source, such as a battery. The power source is further connected to the activation circuit. The activation circuit comprises a power circuit actuator that is operative, when energized to cause the power circuit to become energized by the source and remain energized, by, for example, closing a hard contact, after the activation circuit is deenergized. The activation circuit further includes at least two centrifugal switches that are configured to close when the device is rotated at a rotational activation speed about an axis of rotation, with the closing of the centrifugal switches being adapted to cause the energization of the activation circuit.

In certain preferred embodiments, the housing can comprise a first housing panel and a second housing panel that are assembled together to enclose and seal the internal volume. The housing panels can be formed of, for example, an impermeable material, such as, for example, glass, plastic, or another impermeable material.

In some embodiments the panels may be separable from one another so as to permit disassembly to expose the internal space, and reassembly to reclose and reseal the internal space. Further, a seal may be present so as to make the assembly watertight.

In other embodiments, the housing may be a unified one-piece body that can, for example, be constructed of a moldable polymer material.

BRIEF DESCRIPTION OF THE DRAWINGS

Although the characteristic features of this disclosure will be particularly pointed out in the claims, the disclosed method and system, and how it may be made and used, may be better understood by referring to the following description taken in connection with the accompanying drawings forming a part hereof, wherein like reference numerals refer to like parts throughout the several views and in which:

A person of ordinary skill in the art will appreciate that elements of the figures above are illustrated for simplicity and clarity and are not necessarily drawn to scale. The dimensions of some elements in the figures may have been exaggerated relative to other elements to help to understand the present teachings. Furthermore, a particular order in which certain elements, parts, components, modules, steps, actions, events and/or processes are described or illustrated may not be required. A person of ordinary skills in the art will appreciate that, for simplicity and clarity of illustration, some commonly known and well-understood elements that are useful and/or necessary in a commercially feasible embodiment may not be depicted to provide a clear view of various embodiments per the present teachings.

DETAILED DESCRIPTION

In the following description of various examples of embodiments of the disclosed system and method, reference is made to the accompanying drawings, which form a part hereof, and in which are shown by way of illustration various example devices, systems, and environments in which aspects of the disclosed system and method can be practiced. Other specific arrangements of parts, example devices, systems, and environments, can be used, and structural modifications and functional modifications can be made without departing from the scope of the disclosed system and method.

Figure 1:
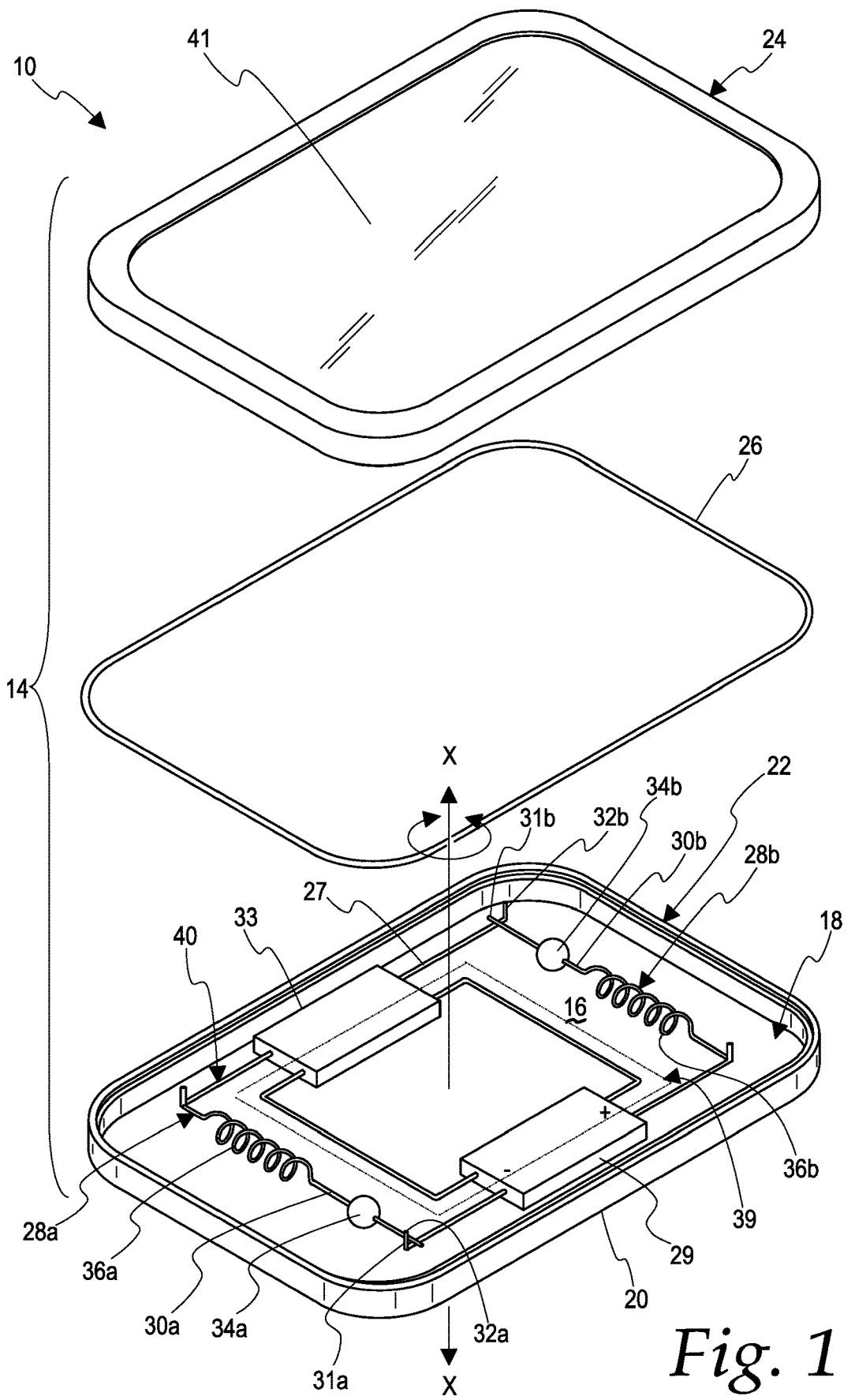
FIG. 1 is. an exploded perspective view of an electronic device according to the disclosure.
Figure 2:
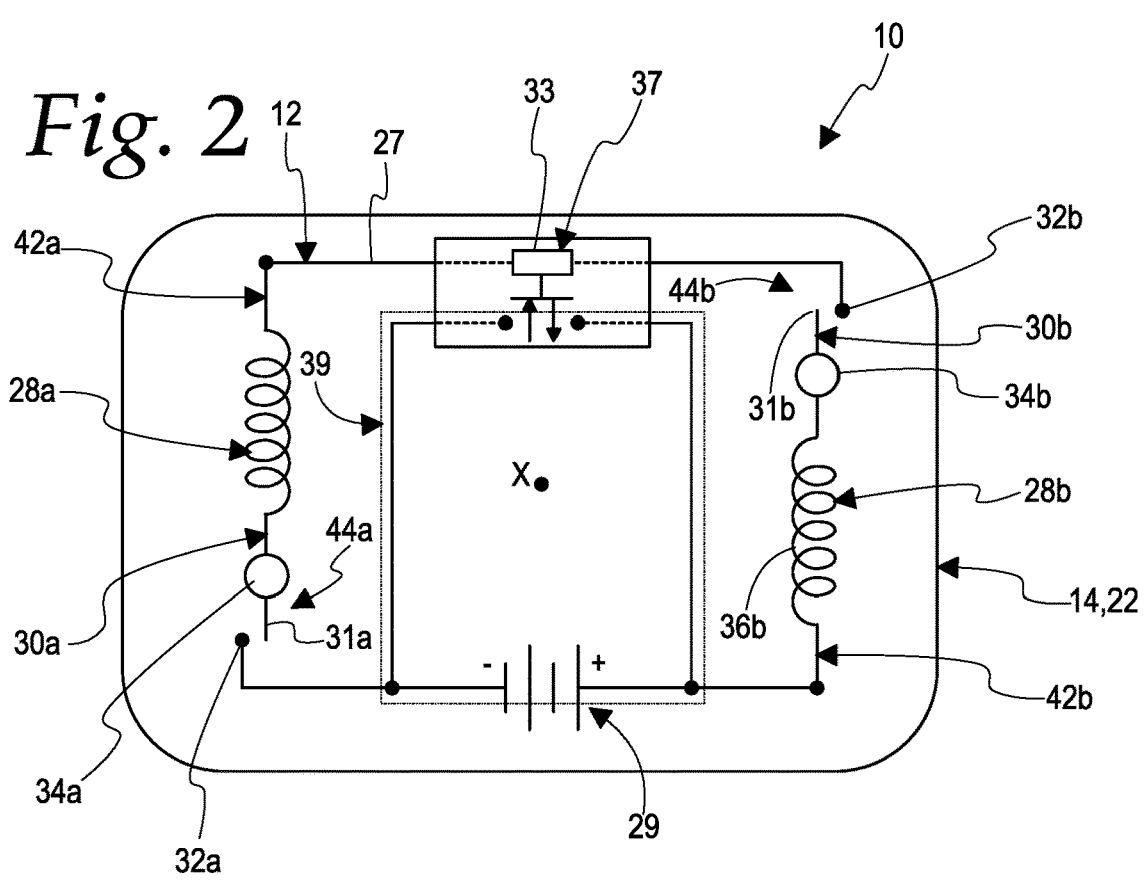
FIG. 2 is a schematic top plan view of the electronic device of FIG. 1.
Figure 3:
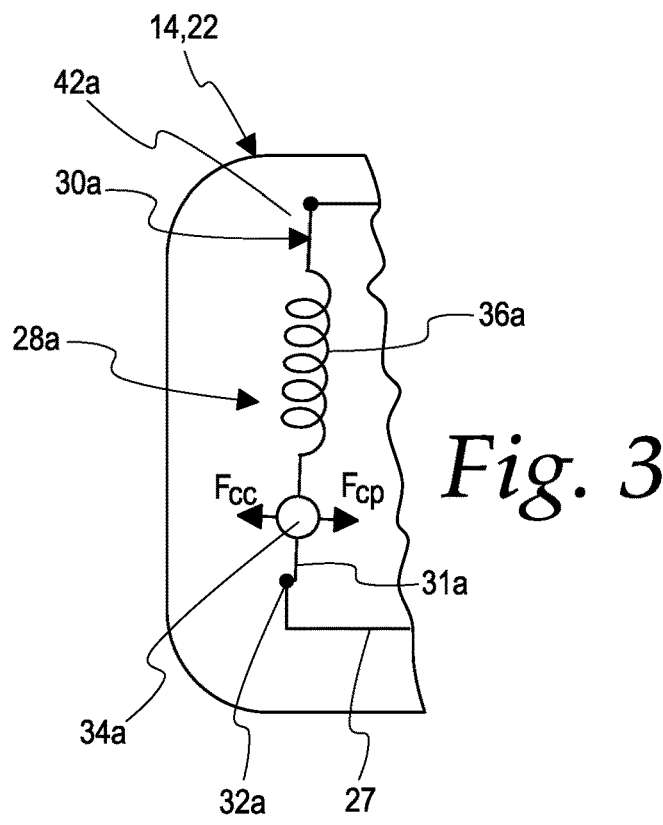
FIG. 3 is a schematic illustration of a switch of the electronic device of FIG. 1.

As illustrated in the accompanying drawings and described herein, the present disclosure provides a handheld device that can be activated by a specialized circuit without the use of an external switch or button. In particular, a device 10 as shown in FIGS. 1-3 includes an activation circuit 12, a power circuit 39, and a housing 14. The activation circuit 12 and the power circuit 39 are enclosed within the housing 14. More particularly, the housing 14 comprises an inner side 16 that surrounds a sealed internal volume 18, the activation circuit 12 being sealed from an outer side 20 of the housing 14 by the inner side 16. In the illustrated embodiment, the housing 14 is a two-piece shell formed by assembling a first housing panel 22 to a second housing panel 24. The housing panels 22 and 24 are formed of suitable relatively stiff impermeable materials (such as glass and/or a hard plastic material) and assembled together so as to enclose and seal the internal volume 18. Optionally, the panels 22, 24 permit tooled or toolless non-destructive disassembly from each other to open the internal volume 18 for maintenance and/or repair of the device 10 and reassembly to each other so as to reclose and reseal the internal volume 18. The housing 14 further includes a sealing layer 26 (which may comprise adhesive or an elastomeric gasket ring, for example), the sealing layer 26 being retained between the housing panels 22 and 24 so as to seal a closure interface between the housing panels 22 and 24. Specifically, the sealing layer 26 is operative to form a watertight seal, to keep the activation circuit 12 dry at all times while retained in the internal volume 18 of the assembled housing 14. In other embodiments not shown, a device housing according to this disclosure is of a one-piece construction formed (e.g., molded of a suitable moldable polymer material) around a circuit so that a continuous inner surface surrounding an internal volume constitutes an inner side of the device housing.

The structure and operation of the activation circuit 12 to turn the device 10 "on" is now described. As seen in FIG. 1, the activation circuit 12 has at least one operative axis of rotation X and includes a conductive element (shown as a wire 27), a power source (shown as a battery 29), a pair of centrifugal switches 28a, 28b operative to energize and deenergize the activation circuit 12, and a power circuit actuator 37. Each centrifugal switch 28a, 28b comprises a movable contact 30a, 30b and a corresponding fixed contact 32a, 32b. At least a portion of each movable contact 30a, 30b is movable in a centrifugal direction (with respect to the rotational axis X) from an open position not electrically contacting the corresponding fixed contact 32a, 32b (shown in FIG. 1 and illustrated schematically in FIG. 2) to a closed position electrically contacting the fixed contact 32a, 32b (as illustrated schematically in FIG. 3 for the switch 28a); and in a centripetal direction from the closed position to the open position. The movable portion of each movable contact 30a, 30b comprises a respective contact point 31a, 31b, which in the closed position contacts the corresponding fixed contact 32a, 32b, as illustrated schematically in FIG. 3 for the switch 28a.

It will be noted that, although the term "open position" is referred to here in the singular for ease of description, in the case of the illustrated embodiment, the switch 28a, 28b moves through a series of open positions, ranging radially outwardly from a radially innermost open position (described further below as a "home position") to a radially outermost open position, just before the contact point 31a, 31b meets the fixed contact 32a, 32b. The term "open position" is not intended to be limited to any one of these open positions except where clearly so indicated. Similarly, in other embodiments within the scope of this disclosure, a movable contact can have not only one closed position but a range of closed positions through which it slides over a fixed contact.

The movable contact 30a, 30b is adapted and configured so that, when the movable contact 30a, 30b is displaced radially outwardly to or toward the closed position, the movable contact 30a, 30b is acted upon by a passive centripetal biasing force $F_{cp}$ tending to force the movable contact 30a, 30b to return radially inwardly, toward the open position and away from the closed position. More particularly, the switch 28a, 28b includes a biasing element, illustrated as a spring element 36a, 36b, the spring element 36a, 36b being operative to bias the contact point 31a, 31b centripetally whenever the contact point 31a, 31b is so displaced. Still more particularly, the movable contact 30a, 30b further comprises a conductive fixed end portion 42a, 42b, a conductive free end portion 44a, 44b, and a connecting portion, the connecting portion comprising an electrically conductive element that operatively extends from the fixed end portion 42a, 42b to the free end portion 44a, 44b. The contact point 31a, 31b is comprised in the free end portion 44a, 44b, and the spring element 36a, 36b is comprised in the connecting portion of the movable contact 30a, 30b. The spring element 36a, 36b is adapted and configured to be loaded in flexion (bending), and the movable contact 30a, 30b can also be referred to as a flexible contact. More particularly, the spring element 36a, 36b itself is electrically conductive, and the electrically conductive element of the connecting portion comprises the spring element 36a, 36b.

In other embodiments not shown, a movable switch contact can be movably mounted to a housing in operative connection to a separately formed centripetal biasing element, so that the movable contact itself need not flex or deform so as to produce a centripetal biasing force. Such a separately formed centripetal biasing element can, for example, either be electrically non-conductive or insulated from the movable switch contact by electrically non-conductive material.

In addition, each movable contact 30a, 30b has a corresponding mass 34a, 34b affixed to (for example, integrally formed or attached to) its free end portion. In operation, to activate the handheld device 10 incorporating the activation circuit 12, a user rapidly rotates the device 10 back and forth in the user's hand about the axis of rotation X. Typically, a user may perform this movement by grasping the device between the user's thumb and fingers on opposite sides of the axis of rotation X, with the axis X approximately aligned with the user's forearm, so that rapid pronation and supination of the user's forearm produces rotational agitation of the device 10 about the axis X. When a user agitates the device 10 in this manner so as to rotate the device at or above a rotational activation speed about the axis X, the mass 34a, 34b is acted upon by a centrifugal activation force $F_{cf}$ and transmits the centrifugal activation force $F_{cf}$ to the contact point 31a, 31b so as to overcome the centripetal biasing force $F_{cp}$ and drive the contact points 31a, 31b of the movable contact 30a, 30b radially outwardly into electrical contact with the fixed contacts 32a, 32b, so as to close the switches 28a, 28b. Closing both switches 28a, 28b completes the activation circuit 12, resulting in the device 10 being powered on. As explained in more detail further below, in embodiments, momentarily energizing the activation circuit 12 triggers the device 10 to be "turned on," to remain "on" even when the activation circuit 12 is deenergized by reopening the switches 28a, 28b, and to turn "off" only upon the occurrence of a shutoff condition.

When the device 10 is at rest, the movable contact 30a, 30b is biased centripetally to a home position by the spring element 36a, 36b. In the illustrated embodiment, the home position is an open position of the movable contact 30a, 30b in which the spring element 36a, 36b is fully extended to a relaxed state, as shown in FIG. 1 and illustrated schematically in FIG. 2. In other embodiments, the switch 28a, 28b further includes a home stop (not shown), the home stop being an integral member or projection of the housing 14 that is disposed radially inwardly of and abuts the movable contact 30a, 30b in the home position. In such embodiments, the spring element 36a, 36b in the home position can either be relaxed or preloaded in flexion, the home stop (not shown) in the latter case serving to obstruct the spring element 36a, 36b from fully extending to a relaxed state, and thus preventing the spring element 36a, 36b from overshooting and oscillating about the home position when returning from a flexed state. In addition, preloading the spring element 36a, 36b can have the benefit of substantially preventing any movement of the movable contact 30a, 30b until a centrifugal force equal to or approaching $F_{cf}$ is applied to the mass 34a, 34b, thus avoiding unnecessary wear.

In embodiments, the power circuit actuator 37 is a suitable switch component (depicted schematically in FIG. 2 as including a conductive member that is operative to extend and retract linearly—up and down in the figure—to connect and disconnect a pair of terminals), which is energized by completing the activation circuit 12. When energized, the power circuit actuator 37 closes a switch to complete the power circuit 39. The power circuit 39 includes the battery and electronic componentry 33 (comprising one or more electronic components and referred to interchangeably as electronic components 33), so that closing the power circuit 39 causes power to be delivered from the battery 29 to the electronic componentry 33. It will be appreciated that many internally powered electronic devices are configured to deliver power to certain electronic components even when the device is in an "off" state, while other components are energized only when the device is switched to an "on" state. To simplify this description, it will be understood that the electronic componentry 33 consists of components that are deenergized when the device 10 is in an "off" state, while embodiments of the device 10 may include other electronic components not shown, which may be connected to the battery 29 or to another internal power source by a permanently closed additional power circuit not shown. In the illustrated embodiment, the power circuit actuator 37 is illustrated schematically as being housed with the electronic components 33. In other embodiments not shown, a power circuit actuator triggered by completing an activation circuit can be mounted and/or housed separately from componentry powered by a power circuit activated by the power circuit actuator.

Once the electronic components 33 are powered on by activating the power circuit actuator 37, the electronic components 33 are adapted and configured with suitable circuit logic to maintain the device 10 in an on state (that is, to keep the power circuit 39 energized) until a shutdown event occurs. In the illustrated example in which the device 10 is a smartphone, the electronic components 33 are adapted and configured to direct power from the battery 29 to activate a touchscreen interface 44 whenever the device is powered on, and in response to a shutdown command input by a user through the touchscreen interface 44, to disconnect power from the battery 29 to the electronic components 33, or at least to those of the electronic components 33 that are supplied power only when the device 10 is in the on state. In other embodiments (not shown) according to the disclosure, a device activated by a centrifugal activation circuit lacks a user input interface. In such cases, electronic componentry that is powered on by activation of a centrifugal circuit may be adapted and configured to shut itself off automatically upon the occurrence of a predetermined shutdown event, such as a certain amount of time passing or the device completing an operation.

To help prevent or reduce the incidence of accidental activations, the switches 28a, 28b can be arranged in series in the activation circuit 12, so that both switches 28a, 28b must be closed to complete the activation circuit 12. In another implementation, the switches 28a, 28b are in separate circuits that provide inputs to a relay or transistor that operates as an electronic logical AND gate, wherein the output of the AND gate determines activation of the power circuit 39. More particularly, in the illustrated embodiment, the switches 28a, 28b are mounted close to the outer side 20 of the housing 14, along opposite lateral sides 38, 40 of the housing 14, and on opposite sides of the operative axis of rotation X (that is, angularly spaced apart about the axis X by more than ninety degrees) and more particularly angularly spaced apart about the axis X by about one-hundred eighty degrees, and the centripetal biasing forces $F_{cp}$ being generally opposite in direction (that is, differing in direction by more than ninety degrees) and more particularly differing in direction by about one-hundred eighty degrees, so that the centrifugal forces $F_{cf}$ required to close the two switches 28a, 28b act upon the attached masses 34a, 34b in generally opposite directions. Generally, only rotating the housing about the axis X will simultaneously produce such oppositely directed forces acting on the masses 34a, 34b, thus reducing the likelihood of accidental activation.

The activation circuit 12 is adapted for use in a variety of devices. The switches 28a, 28b being operable without requiring any movable linkage extending from outside the housing 14 into its internal volume 18 makes the activation circuit 12 particularly advantageous for use in electronic devices that benefit from a generally monolithic enclosure, free of exposed moving parts. For example, without limitation, the activation circuit 12 may be beneficially incorporated into electronic devices that need to be highly durable and/or waterproof. Specific examples of such devices include a cell phone with no buttons, a dive computer, and a fuel sensor located inside of a tank that can be periodically activated by agitation.

The preceding description of the disclosure has been presented for purposes of illustration and description and is not intended to be exhaustive or to limit the disclosure to the precise form disclosed. The description was selected to best explain the principles of the present teachings and practical application of these principles to enable others skilled in the art to best utilize the disclosure in various embodiments and various modifications as are suited to the particular use contemplated. It should be recognized that the words "a" or "an" are intended to include both the singular and the plural. Conversely, any reference to plural elements shall, where appropriate, include the singular.

It is intended that the scope of the disclosure not be limited by the specification, but be defined by the claims set forth below. In addition, although narrow claims may be presented below, it should be recognized that the scope of this disclosure is much broader than presented by the claim(s). It is intended that broader claims will be submitted in one or more applications that claim the benefit of priority from this application. Insofar as the description above and the accompanying drawings disclose additional subject matter that is not within the scope of the claim or claims below, the additional disclosures are not dedicated to the public and the right to file one or more applications to claim such additional disclosures is reserved.

What is claimed is:

1. A centrifugally activated electronic device comprising
a housing, the housing enclosing and sealing an internal volume;
an activation circuit disposed in the internal volume of the housing;
a power circuit disposed in the internal volume of the housing, the power circuit including electronic componentry;
a power source connected to the activation circuit and to the power circuit;
the power circuit including electronic componentry;
the activation circuit including a power circuit actuator, the power circuit actuator being operative, when energized, to cause the power circuit to become energized by the power source and to remain energized by the power source after the activation circuit is deenergized;
the activation circuit including two or more centrifugal switches, the centrifugal switches being configured to close when the device is rotated at a rotational activation speed about an operative axis of rotation, the activation circuit being adapted and configured to be energized by the power source when the centrifugal switches are closed.

2. The device of claim 1 further comprising the housing comprising a first housing panel and a second housing panel, the first and second housing panels being assembled together to enclose and seal the internal volume.

3. The device of claim 2 wherein each of the first housing panel and the second housing panel is formed of an impermeable material.

4. The device of claim 3 wherein the impermeable material is selected from glass and plastic.

5. The device of claim 2 wherein the first and second housing panels are assembled to each other so as to permit disassembly from each other to expose the internal volume, and wherein the first and second housing panels are adapted and configured to permit reassembly to each other to reclose and reseal the internal volume after being so disassembled.

6. The device of claim 2 wherein the first and second housing panels are assembled so as to form a closure interface between them, further comprising a sealing layer retained between the first and second housing panels so as to seal the closure interface.

7. The device of claim 6 wherein the sealing layer is operative to form a watertight seal.

8. The device of claim 1 wherein the housing is of a one-piece construction.

9. The device of claim 8 wherein the housing is molded of a suitable moldable polymer material.

10. The device of claim 1 wherein each centrifugal switch comprises a movable contact and a fixed contact, the movable contact comprising a movable contact point, at least the movable contact point being movable in a centrifugal direction with respect to the operative axis of rotation from an open position not electrically contacting the fixed contact to a closed position electrically contacting the fixed contact, the switch further comprising a biasing element, the biasing element being operative to produce a centripetal biasing force to bias the movable contact point centripetally when the movable contact point is displaced centrifugally from the open position.

11. The device of claim 10 wherein the movable contact includes an electrically conductive fixed end portion, an electrically conductive free end portion, and a connecting portion, the connecting portion comprising an electrically conductive element that operatively extends from the fixed end portion to the free end portion, the biasing element being comprised in the connecting portion.

12. The device of claim 11 wherein the biasing element is electrically conductive, and the electrically conductive element of the connecting portion comprises the biasing element.

13. The device of claim 10 wherein the centrifugal switch further comprises a mass affixed to the free end portion, the mass being adapted and configured so that, when the device is rotated about the operative axis of rotation at the rotational speed of activation, the mass transmits a centrifugal activation force to the movable contact point, the centrifugal activation force overcomes the centripetal biasing force so as to drive the movable contact point radially outwardly into electrical contact with the fixed contact.

14. The device of claim 1 wherein the centrifugal switches are configured in series in the activation circuit so that the activation circuit is energized only when all the centrifugal switches are closed.

15. The device of claim 14 wherein the centrifugal switches comprise a first centrifugal switch and a second centrifugal switch that are disposed on opposite sides of the operative axis of rotation, the centripetal biasing force of the first centrifugal switch being generally opposite in direction to the centripetal biasing force of second centrifugal switch.

16. The device of claim 1 wherein the electronic componentry, when energized, is adapted and configured with logic to keep the power circuit energized by the power source until the occurrence of a predetermined shutdown event, and in response to the shutdown event, to cause the power circuit to be deenergized.

17. The device of claim 16 further comprising a touchscreen interface, the electronic componentry being adapted and configured, when energized, to direct power from the power source to activate the touchscreen interface, the touchscreen interface being operative to receive a shutdown command input by a user and to transmit the shutdown command to the electronic componentry, and in response to receiving the shutdown command from the touchscreen interface, the electronic componentry being operative to cause the power circuit to be deenergized.

* * * * *